United States Patent [19]
Sutphin, Jr.

[11] B 3,995,224
[45] Nov. 30, 1976

[54] FAST AUTOMATIC GAIN CONTROL CIRCUIT WITH ADJUSTABLE RANGE

[75] Inventor: Eldon Marvin Sutphin, Jr., Merrimack, N.H.

[73] Assignee: RCA Corporation, New York, N.Y.

[22] Filed: Apr. 30, 1975

[21] Appl. No.: 573,033

[44] Published under the second Trial Voluntary Protest Program on March 23, 1976 as document No. B 573,033.

[52] U.S. Cl. .............................. 328/168; 307/237; 307/264; 328/161; 328/173
[51] Int. Cl.² ...................... H03B 3/02; G06G 7/16
[58] Field of Search ............ 307/237, 264; 328/161, 328/171–173; 330/29, 129

[56] References Cited
UNITED STATES PATENTS 3,631,262  12/1971  Jarrett............................ 328/161 X
3,654,424  4/1972  Vanderheist.................... 328/161 X

*Primary Examiner*—John Zazworsky
*Attorney, Agent, or Firm*—Carl V. Olsen; Edward J. Norton

[57] ABSTRACT

An automatic gain control circuit has its a-c signal input terminal connected directly to the numerator input of an analog divider, and connected through a peak detector to the denominator input of the analog divider. The quotient terminal of the analog divider provides a gain-controlled a-c signal output. The AGC circuit produces a constant amplitude output signal so long as the amplitude of the input signal exceeds an adjustable reference voltage applied to the peak detector. The reference voltage may be changed to change the range of input voltages resulting in a constant-amplitude output. The AGC circuit responds almost instantly to control a sudden increase in input voltage.

4 Claims, 3 Drawing Figures

FAST AUTOMATIC GAIN CONTROL CIRCUIT WITH ADJUSTABLE RANGE

BACKGROUND OF THE INVENTION

Although there are many known automatic gain control circuits, there is a need for an AGC circuit which responds very quickly to a sudden increase in input voltage without over or under shoot, and which produces a constant output amplitude in response to input signal amplitudes within an adjustable range. One application for an AGC circuit having the described characteristics is in an apparatus for measuring the power of an internal combustion engine by performing an acceleration burst test without making electrical or mechanical connections to the engine.

SUMMARY OF THE INVENTION

An a-c input signal having a rapidly-increasing amplitude is translated to a constant amplitude a-c output signal by dividing the input signal by the peak voltage of the input signal in an analog divider. The peak voltage of the input signal is generated by a peak detector having a reference voltage input which controls the range of input signal amplitudes resulting in a constant amplitude output signal.

DESCRIPTION OF THE PREFERRED EMBODIMENT

Figure 1:
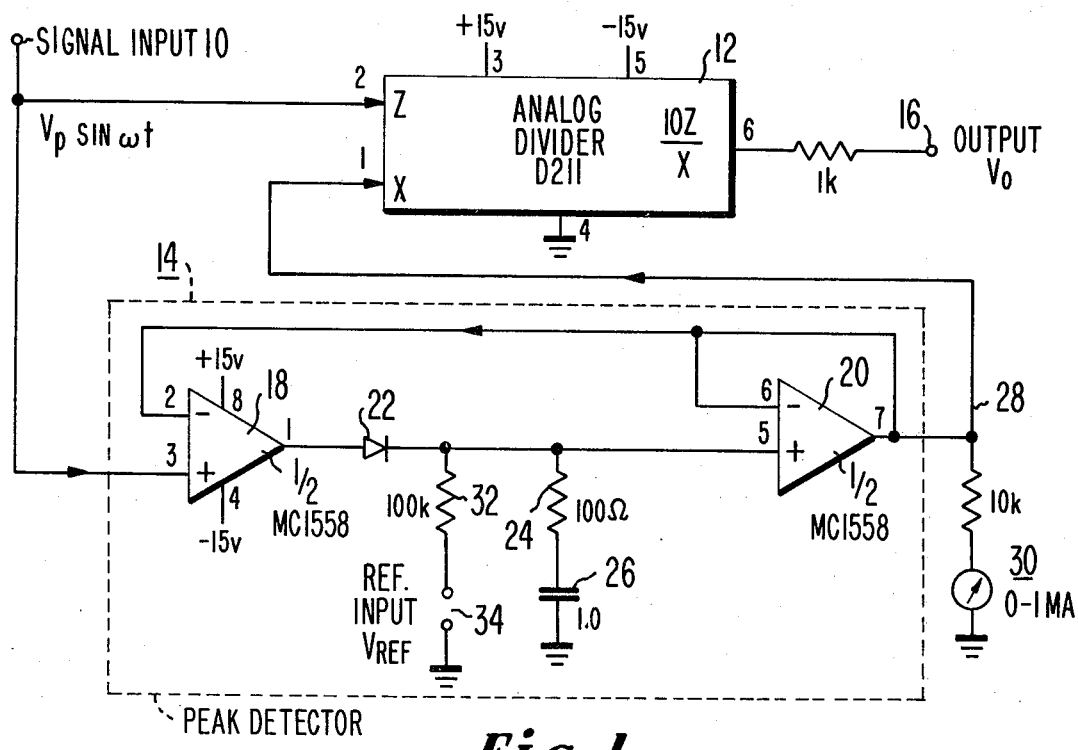
FIG. 1 is a circuit diagram of an automatic gain control circuit constructed according to the teachings of the invention.

Referring now in greater detail in FIG. 1, there is shown an automatic gain control circuit consisting of an a-c input signal terminal 10 connected to the numerator input Z of an analog divider 12, and connected through a peak detector 14 to the denominator input X of the divider, and an output terminal 16 coupled to the quotient output 10Z/X of the divider. The analog divider 12 may be an Intronics, Inc. type D210 wide dynamic range analog divider. The output is equal to ten times the quotient of the numerator Z divided by the denominator X.

The peak detector 14 may include the two operational amplifiers 18 and 20 of a Motorola Corp. operational amplifier unit MC1558. The operational amplifiers are connected with a diode 22, a resistor 24 and a capacitor 26 to form a noninverting peak detector. The operational amplifier 20 is connected as a unity gain follower inside the overall feedback loop. Every voltage peak of an a-c signal applied to the + input of operational amplifier 18 causes a corresponding charge to be added to the charge or voltage on capacitor 26. This voltage is transmitted over lead 28 to the denominator input X of the analog divider 12. A meter circuit 30 is provided for use if necessary when making adjustments in the circuit for a particular input signal applied to input terminal 10. Further information about the construction of noninverting peak detector circuits may be found on pages 355,356 of "Operational Amplifiers--Design and Applications" edited by Tobey, Graeme and Huelsman, and published by McGraw-Hill in 1971.

The peak detector 14 includes a resistor 32 and terminals 34 for the application of a d-c reference voltage from a source not shown. A reference voltage amplitude is selected so that all levels of input signal above a desired threshold (equal to the reference voltage) result in a constant-amplitude output signal at the output terminal 16.

OPERATION

The input a-c signal applied to terminal 10 and to numerator input Z of divider 12 may be described by the formula:

$$V_p \sin wt \tag{1}$$

where $V_p$ is the peak voltage. This signal is also applied to the peak detector, the output of which is equal to the voltage $V_p$ when the input signal peak voltage is greater than $V_{ref}$. This voltage $V_p$ is applied to the denominator input X of the analog divider 12. The output $V_o$ at 16 from the divider is then:

$$V_o = \frac{10 V_p \sin wt}{V_p} = 10 \sin wt \tag{2}$$

The output remains at the constant value of 10 sin wt regardless of variations in the value of the input peak voltage $V_p$.

On the other hand, if the peak voltage $V_p$ of the input signal is less than the reference voltage $V_{ref}$, the output at 28 from the peak detector 14 is a voltage equal to $V_{ref}$. Then the output $V_o$ at 16 from the analog divider 12 is:

$$V_o = \frac{10 V_p \sin wt}{V_{ref}} \tag{3}$$

which is a straight line relationship of increasing voltage as $V_p$ increases, because $V_{ref}$ is constant.

Figure 2:
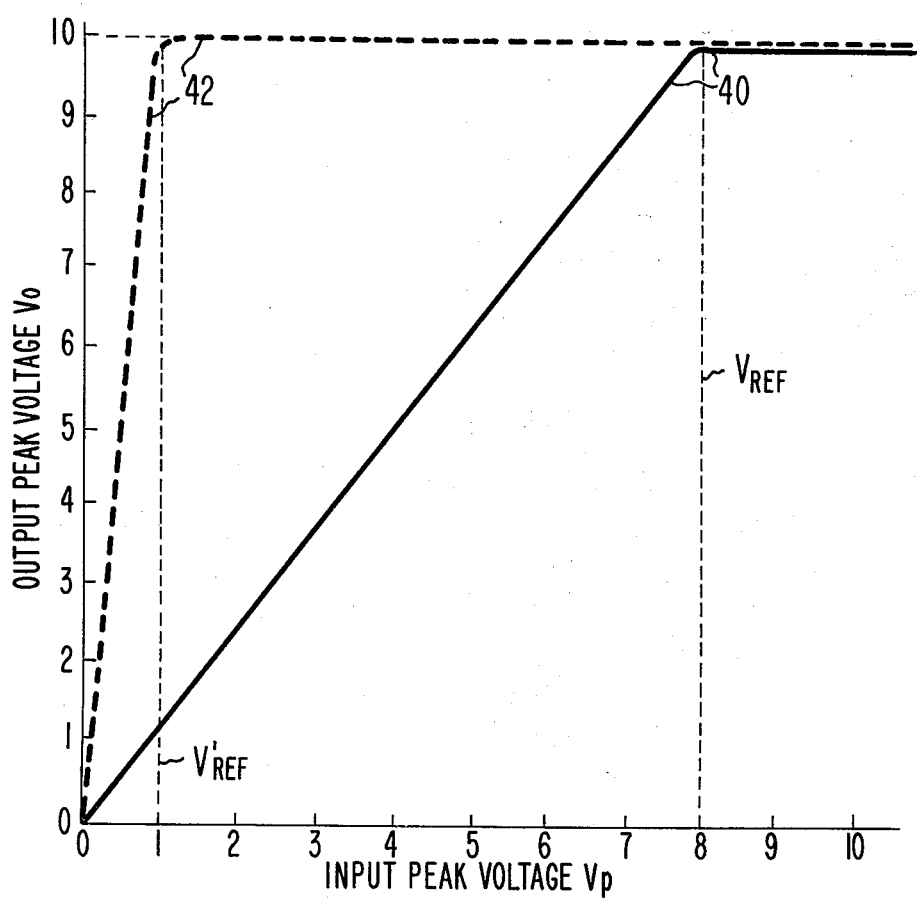
FIG. 2 is an input-output characteristic chart which will be referred to in describing the operation of the invention.

FIG. 2 shows at 40 how the output peak voltage $V_o$ varies in response to input peak voltage when the reference voltage $V_{ref}$ is equal to 8 volts. The output is constant when the input peak voltage exceeds 8 volts. The output peak voltage varies linearly with input peak voltage when input peak voltage is less than 8 volts.

The dashed curve 42 shows how the output peak voltage $V_o$ voltage varies in response to input peak voltage when the reference voltage $V_{ref}$ is equal to 1 volt. The output is constant when the input peak voltage exceeds 1 volt. It is thus seen that any desired dynamic range of input signal amplitudes over which a constant output signal amplitude is provided can be established by merely employing a reference voltage $V_{ref}$ of appropriate value.

Figure 3:
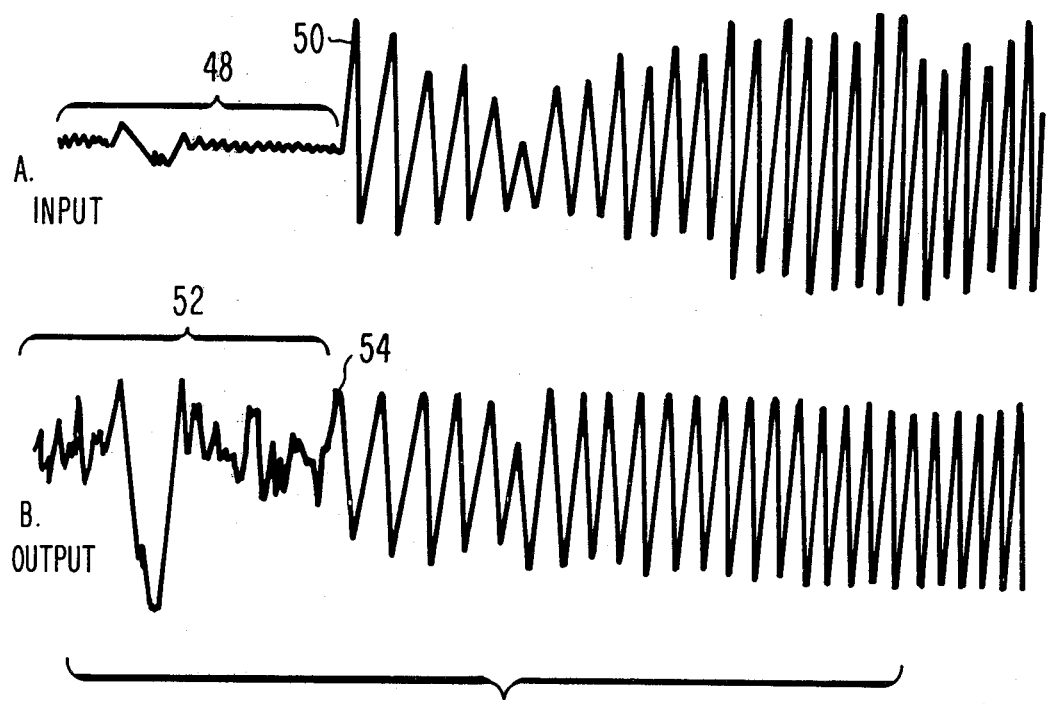
FIG. 3 is an input-output waveform chart which will be referred to in describing the operation of the invention.

FIG. 3 illustrates how rapidly the automatic gain control circuit operates to limit the output signal amplitude when the input signal amplitude suddenly increases. The input wave A, having a frequency of about 100 Hz, has an initial low amplitude 48 which suddenly increases during a positive half cycle 50 of the input wave. The output wave B has an initial period 52 during which the input wave is highly amplified, and then the amplification of the input half cycle 50 is immediately limited in the output wave at 54 to the predetermined gain controlled amplitude. Following cycles are also similarly limited. The wave shown by way of example increases in frequency because it is generated during an acceleration burst test in an apparatus for measuring the power of an internal combustion engine.

What is claimed is:

1. An automatic gain control circuit having a signal input terminal and a signal output terminal, comprising an analog divider having a numerator input coupled to said signal input terminal, and having a quotient output coupled to said signal output terminal, and a peak detector coupled from said signal input terminal to the divisor input of said analog divider.

2. A circuit as defined in claim 1 wherein said peak detector includes means to clamp its output at a reference voltage when the signal input is less than the reference voltage.

3. A circuit as defined in claim 2 wherein said peak detector includes a first operational amplifier having an output coupled through a diode to a capacitor and to a unity-gain follower buffer operational amplifier connected in a feedback loop back to said first operational amplifier.

4. A circuit as defined in claim 3 wherein a reference potential source is connected to charge said capacitor to said reference voltage.

* * * * *